(12) United States Patent
Kobayashi

(10) Patent No.: US 6,201,440 B1
(45) Date of Patent: Mar. 13, 2001

(54) POWER AMPLIFIER AND CONTROL CIRCUIT THEREOF

(75) Inventor: Takeshi Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/317,190

(22) Filed: May 24, 1999

(30) Foreign Application Priority Data

Jun. 23, 1998 (JP) ................................................. 10-176101

(51) Int. Cl.$^7$ ...................................................... H03G 3/20
(52) U.S. Cl. .............................. 330/51; 330/133; 330/140
(58) Field of Search ................................. 330/51, 124 R, 330/129, 133, 134, 140

(56) References Cited

U.S. PATENT DOCUMENTS

| | | | |
|---|---|---|---|
| 5,530,923 | * | 6/1996 | Heinonen et al. ................. 330/51 X |
| 5,841,319 | * | 11/1998 | Sato ................................. 330/140 X |
| 5,909,643 | * | 6/1999 | Aihara ............................. 330/51 X |

FOREIGN PATENT DOCUMENTS

| | | |
|---|---|---|
| 4-948808 | 2/1992 | (JP) . |
| 6-53753 | 2/1994 | (JP) . |
| 6-196955 | 4/1994 | (JP) . |
| 9-148852 | 6/1997 | (JP) . |

* cited by examiner

*Primary Examiner*—Steven J. Mottola
(74) *Attorney, Agent, or Firm*—McGuireWoods LLP

(57) ABSTRACT

A suitable power amplification path is selected from at least one amplification path in a power amplifier, according to at least a signal modulated in one modulation mode, to reduce the size and the efficiency of the power amplifier. The power amplifier in accordance with the present invention comprises a bias voltage control terminal, an output change-over switch, a non-linear amplification path, and a linear amplification path. The non-linear amplification path includes a variable gain amplifier whose gain is set at predetermined gain, and a linear amplifier and a non-linear amplifier which amplify the output of the variable gain amplifier by controlling the bias voltage thereof with the output of a bias voltage control circuit. In the linear amplification path, the bias voltage of the linear amplifier is set constant and the gain of the variable gain amplifier before the linear amplifier is adjusted by controlling the bias voltage thereof, whereby the output level of the power amplifier is controlled. One of both the amplification paths is selected by the output change-over switch according to the required system, and the variable gain amplifier and linear amplifiers are shared for both amplifier paths and the output of the bias voltage control circuit is switched to apply for the corresponding amplifier path.

5 Claims, 5 Drawing Sheets

US 6,201,440 B1

POWER AMPLIFIER AND CONTROL CIRCUIT THEREOF

BACKGROUND OF THE INVENTION

1. Field of the Invention

The present invention relates to a power amplifier, and in particular, to a power amplifier whose structure is reduced in size.

2. Description of Related Arts

Two kinds of output control systems have been employed for the conventional power amplifiers. In an output control system, as shown in FIG. 1, bias voltages of linear amplifiers 3, 4 and 5 are kept constant to keep their gains constant, and programmably variable gain amplifier 2 is arranged before input terminal 6 of power amplifier 1, and the magnitude of an input signal applied to power amplifier 1 is changed by variable gain amplifier 2. In the other system, as shown in FIG. 2, the gain of power amplifier 1 is changed by controlling the bias voltage of linear amplifiers 3, 4, and 5.

In the amplification mode of the conventional power amplifier described above, in particular, in an amplitude modulation mode and a phase modulation mode, since the data are transmitted by changing of amplitude component, a distortion produced during the compression of the data by the power amplifier, deteriorates the quality of the data. Therefore, the power amplifier needs to be used in a linear amplification range, which reduces the efficiency of the power amplifier. This is a serious matter to induces a problem that the power amplifier itself or the control system therefor needs to be selected according to the modulation mode of signal.

SUMMARY OF THE INVENTION

It is an object of the present invention to provide a power amplifier which does not require to be changed according to the kinds of signals to be amplified.

In order to achieve the object described above, a power amplifier in accordance with the present invention can execute power amplification at least for a mode of signal and comprises at least one amplification path for a mode of signal, means for selectively connecting the amplification path corresponding to an input signal and bias control means for controlling the bias voltage.

Further, it is preferable that the amplification path described above comprises a first amplification path including a first variable gain amplifier and at least one linear amplifier, and a second amplification path having a non-linear amplifier in addition to the first amplification path, that the means of controlling bias voltage described above comprises a wave detector for detecting an output power level and a comparator for outputting the difference between a level of input wave and the output level detected by the wave detector, and that the first variable gain amplifier and the linear amplifiers are employed commonly for the first and second amplification paths by switching to feed the corresponding required bias voltage.

Further, it is preferable that, in the first amplification path described above, the output of the first variable gain amplifier which is controlled to keep a required amplification factor by being controlled its bias voltage through the bias control means described above and the linear amplifiers are kept to maintain an amplification factor at a predetermined level with another bias control means, and that, in the second amplification path, the output of the first variable amplifier is kept to a constant amplification factor at the predetermined level, to apply to the group of amplifiers including the above-stated linear amplifiers and the above-stated non-linear amplifier, which amplify the power to a required output level by being controlled their bias voltages through the output of the bias control means.

Further, the present invention includes a power amplifier further comprising an exterior second variable gain amplifier to which a bias voltage is applied in parallel to the first variable gain amplifier described above and which is connected to the input side of the first variable amplifier described above.

Still further, the present invention includes a power amplifier in which, for an analog signal, a power amplification path after the first variable gain amplifier described above is set to a saturated state and the exterior second variable gain amplifier described above amplifies the analog signal to a high power level by adjusting the bias voltage thereof and outputs it to the power amplification path and the power amplification path amplifies the power of the analog signal, thereby reducing noises in a receiving band when the power of the signal is amplified, and that, for a digital signal, the power amplification path described above is set to a level below the saturated state by adjusting the bias voltage thereof and amplifies the output of the exterior second variable gain amplifier described above.

Furthermore, the present invention includes a power amplifier further comprising an inter-stage filter between the exterior second variable gain amplifier described above and the first variable gain amplifier described above to suppress a noise which is used to occur in the receiver side.

DESCRIPTION OF THE PREFERRED EMBODIMENTS

Several preferred embodiments of the present invention will be described with reference to the accompanying drawings.

Figure 3:
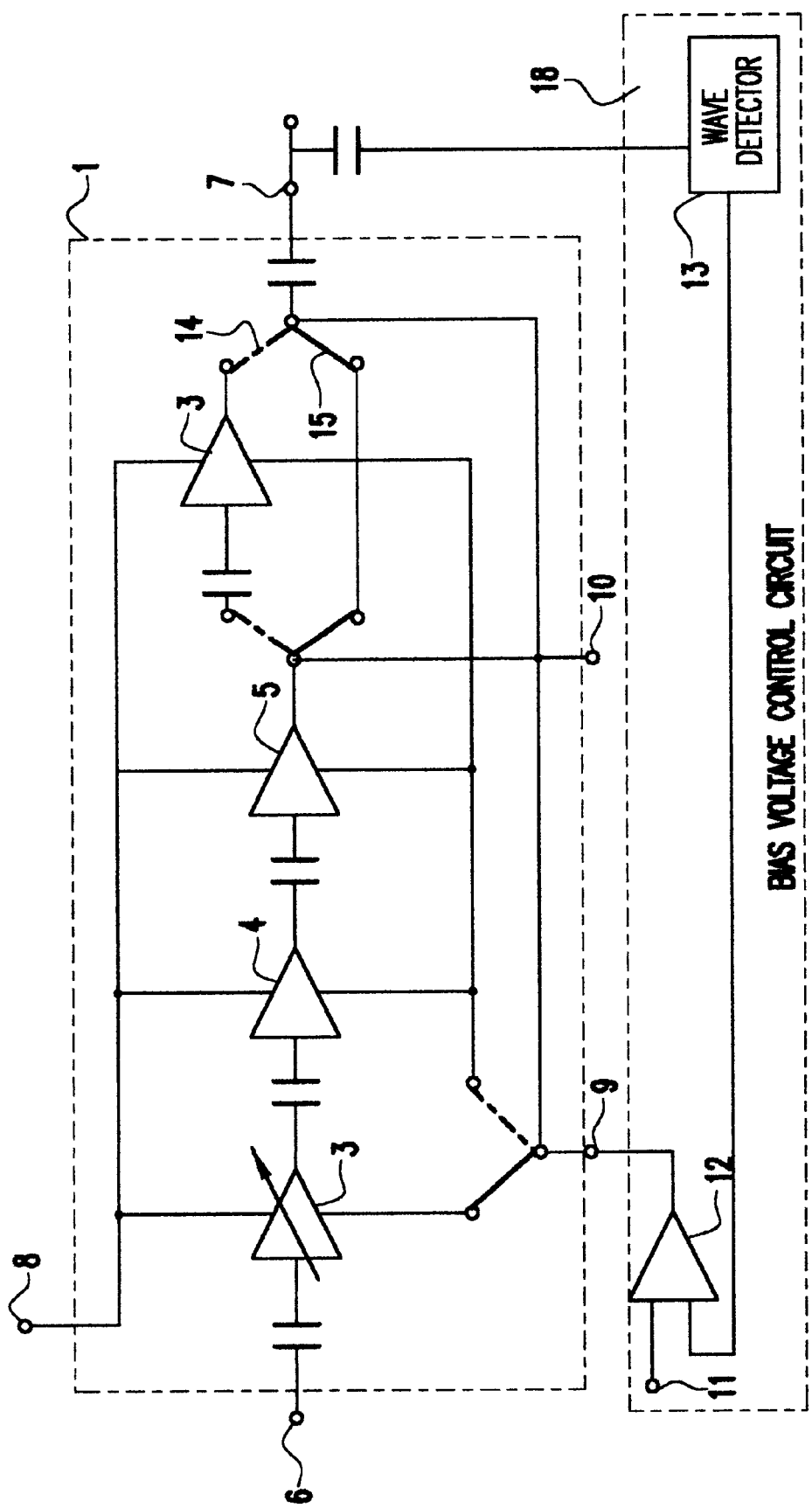
FIG. 3 is a circuit diagram of a first preferred embodiment of a power amplifier in accordance with the present invention.

FIG. 3 shows the circuit diagram of a first preferred embodiment of a power amplifier in accordance with the present invention. The power amplifier is required to have a different characteristic and a control system according to the mode of modulation of signal to be amplified. Power amplifier 1 shown in FIG. 3 is constituted by non-linear amplification path 14 comprising variable gain amplifier 2, linear amplifiers 3 and 4, and non-linear amplifier 17, and performing a non-linear amplification, and linear amplification path 15 comprising variable gain amplifier 2 and linear amplifiers 3 and 4 and performing a linear amplification. Power amplifier 1 shown in FIG. 3 changes an amplification path from non-linear amplification path 14 to linear amplification path 15 by output power change-over switch (hereinafter referred to as $P_{outsw}$) 10 according to the modulation mode of signal in use, thereby performing a power amplification suitable for the modulation mode of signal in use.

Further, power amplifier 1 has power voltage terminal 8, input signal terminal 6, output signal terminal 7, and control voltage terminal 9, and bias voltage control circuit 18 having wave detector 13 and comparator 12 for comparing the output voltage of wave detector 13 with a control signal applied by a control signal input terminal 11 and indicating an amplification voltage and for outputting the difference between them.

Non-linear amplification path 14 comprises a circuit including variable gain amplifier 2 which is set at a given gain and linear amplifiers 3, 4 to which the output of variable gain amplifier 2 is applied, and the non-linear amplifier 17, and amplifies the input signal to a required level by controlling the bias voltage of linear amplifiers 3, 4 and non-linear amplifier 17, thereby the output of the power amplifier 1 is controlled.

The linear amplification path 15 connected by solid line contact of switch $P_{outsw}$ 10 in FIG. 3 keeps the gains of the linear amplifiers 3 and 4 constant at given values by setting the bias voltages constant at a predetermined value, and changes the input level to linear amplifier 3 by adjusting the gains of variable gain amplifier 2 disposed before linear amplifier 3 by controlling the bias voltage, thereby the output level of the power amplifier 1 is controlled.

Either non-linear amplification path 14 or linear amplification path 15 described above are selected by the power output change-over switch switch$_{outsw}$ 10 according to the modulation mode of signal to be amplified.

The structure of bias voltage control circuit 18 for keeping the output level of power amplifier 1 in a constant required level is described hereunder.

Bias voltage control circuit 18 comprises comparator 12 and wave detector 13. Wave detector 13 detects the output voltage of the power amplifier 1. Comparator 12 compares the output voltage detected by the wave detector 13 with a voltage applied at control signal input terminal 11 for controlling the output level of power amplifier 1. The difference between the voltages compared is applied to the control voltage terminal 9 to control the bias voltages of the linear amplifiers 3, 4 and the non-linear amplifier 17 in the case of non-linear amplification path 14, or the bias voltage of variable gain amplifier 2 in the case of linear amplification path 15, thereby the output level of the power amplifier 1 is kept constant.

Action of the preferred embodiment is described hereunder. In general, in the case of a frequency modulation mode, a modulation signal is not affected by distortion due to the compression occurred at the amplification because the amplitude of a modulated signal is constant. Therefore, the power amplifier can be used even in a non-linear range and the efficiency of the power amplifier is high.

In the cases of an amplitude modulation mode and a phase modulation mode, since the data is transmitted by a variation in amplitude component, if data are distorted by the compression during the power amplification, the quality of the data is deteriorated. Therefore, the power amplifier needs to be used within the linear amplification range thereof and hence the efficiency of the power amplifier is reduced. Accordingly, it is necessary to select the different control system of the power amplifier according to the modulation mode.

Figure 1:
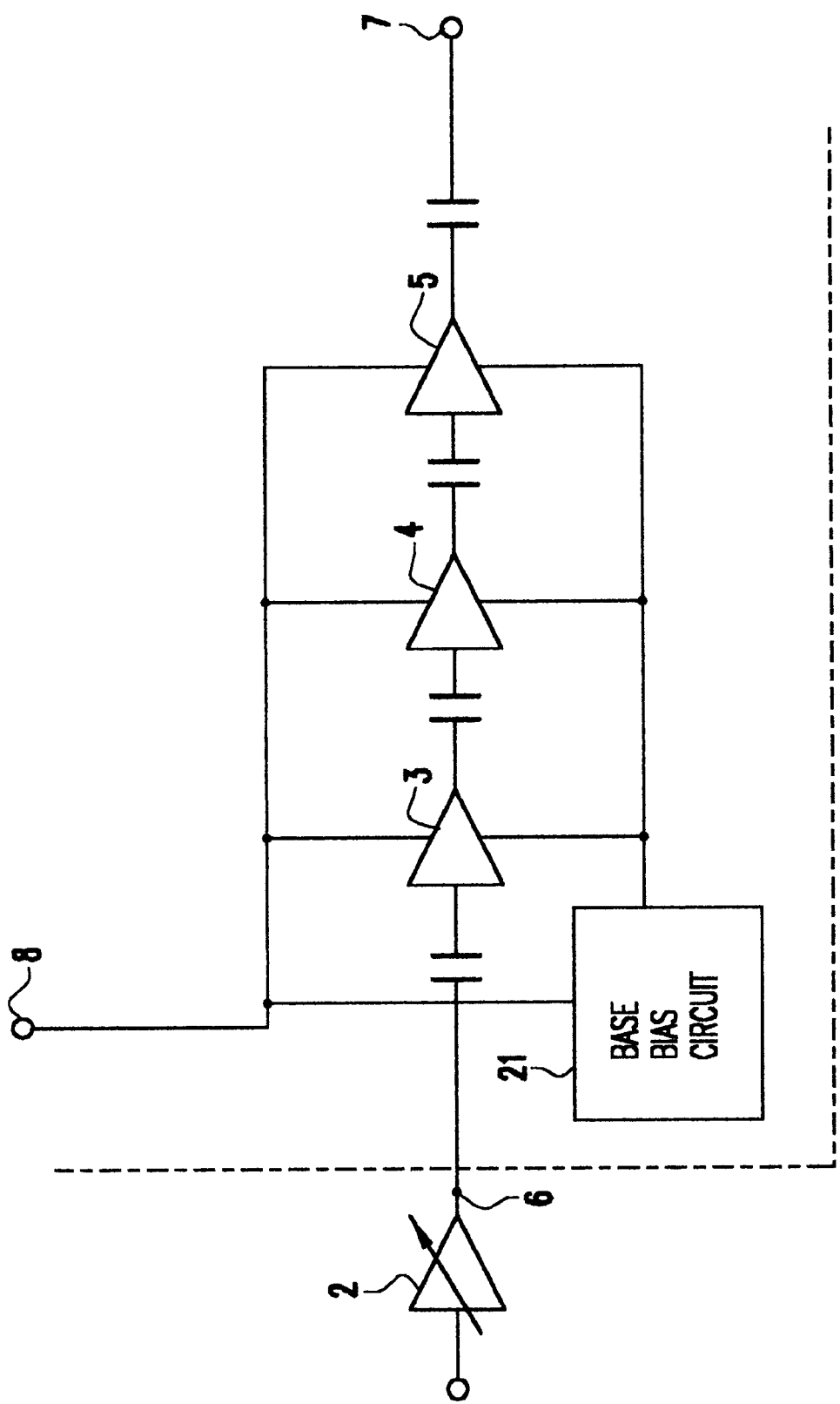
FIG. 1 is an example of a linear amplifier of a conventional power amplifier, in which a bias voltage is fixed and a voltage is adjusted by adjusting the bias voltage of an exterior-type variable gain amplifier.
Figure 2:
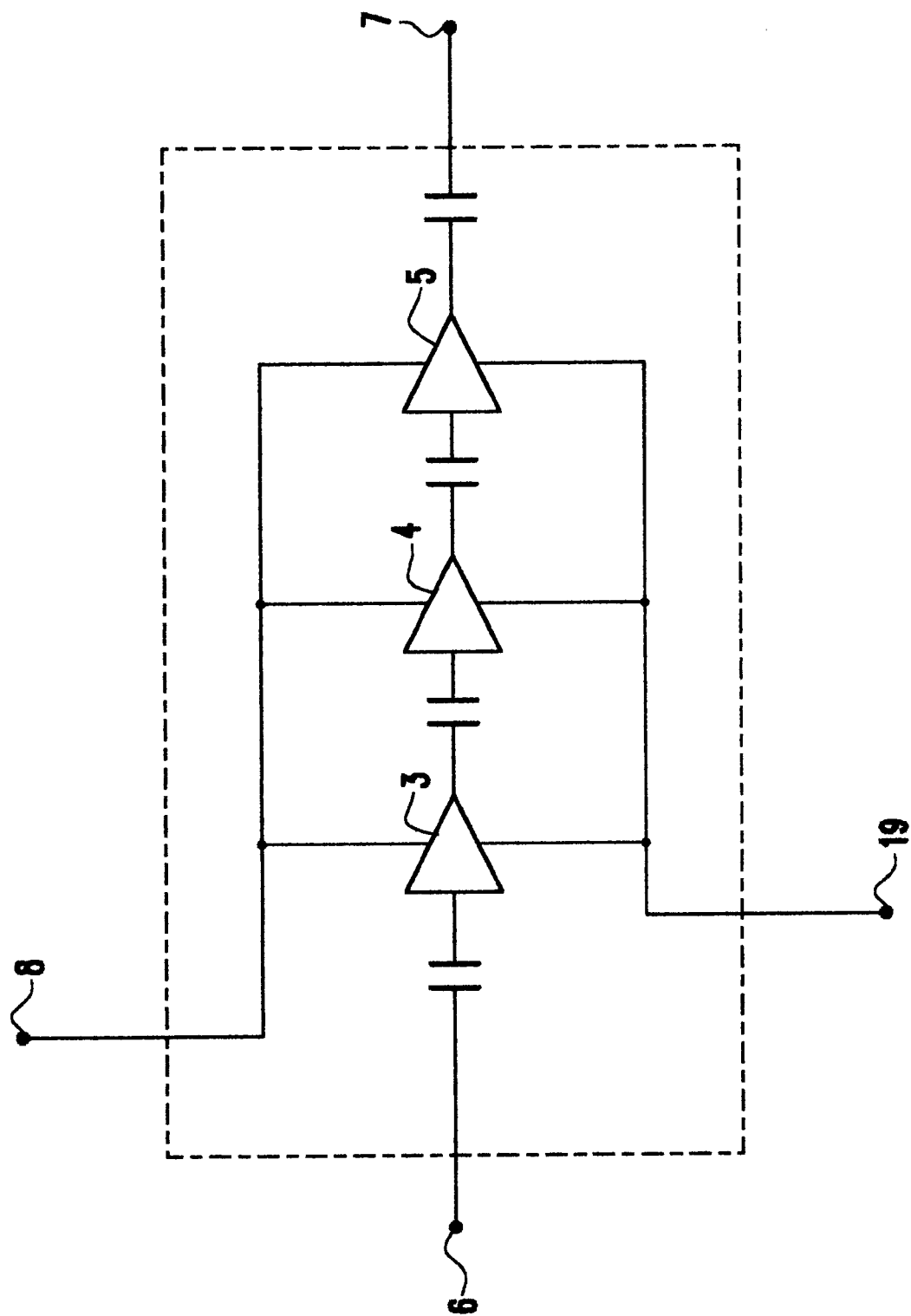
FIG. 2 is another example of a conventional power amplifier, for a signal which is modulated with a mode of modulation available to be amplified by a non-linear amplification, having input side amplifier kept input in a constant voltage and a bias voltage is applied to the power amplifier by a bias control circuit.

In the case of a modulation mode which places emphasis on a linear characteristic, the bias voltages of linear amplifiers 3 and 4 are fixed such as by bias circuit 21 shown in FIG. 1 to keep the gains constant and the contacts shown in FIG. 3 are set as shown by solid lines and the output signal level of the variable gain amplifier 2 is controlled by a bias voltage applied via the control voltage terminal 9 by a control circuit, thereby controlling the output level of the power amplifier 1.

In the case of a modulation mode which accepts a non-linear characteristic, the contacts shown in FIG. 3 are set as shown by dotted lines to keep the signal level of variable gain amplifier 2 constant, and the bias control voltages of linear amplifiers 3, 4 and the non-linear amplifier 17 are controlled by the voltage applied by the bias voltage control circuit 18 through control voltage terminal 9, thereby the output level of the power amplifier 1 is controlled.

Action of the circuit is described hereunder with reference to FIG. 3.

When the linear characteristic of the power amplifier 1 is required, the linear amplification path 15 is employed. That is, a modulated signal is applied to input terminal 6 and to variable gain amplifier 2, the output level of which is adjusted to the suitable output level by variable gain amplifier 2 controlled its bias voltage by bias voltage control circuit 18, and the output of the variable gain amplifier 2 is applied to the linear amplifier 3 in the next stage and is amplified to an output level by the linear amplifiers 3 and 4, whose bias voltages are set so as to produce predetermined constant gain, and then is output from the output terminal 7.

When the non-linear characteristic of power amplifier 1 is required, the non-linear amplification path 14 is employed. The modulated signal is applied to input terminal 6 and is amplified by variable gain amplifier 2, whose bias voltage is set so as to keep the output level constant, and the output of variable gain amplifier 2 is applied to linear amplifier 3 and is amplified by linear amplifiers 3, 4 and the non-linear amplifier 17 to the required output level by the bias voltage controlled by bias voltage control circuit 18, and then is outputted from the output terminal 7.

In either case, the output voltage of power amplifier 1 is detected by wave detector 13. The detected voltage is compared by comparator 12 with the control signal voltage applied from control signal input terminal 11 for adjusting the output level of power amplifier 1 and the voltage difference between the output of power amplifier and control signal is applied to the control voltage terminal 9 to keep the output level of power amplifier 1 to a required level.

That is, when the linear characteristic of the power amplifier is required, the output of bias voltage control circuit 18 applied to the control voltage terminal 9 adjusts the bias voltage of variable gain amplifier 2 to control the output thereof, thereby conducting an input signal level control to the power amplifier 1. When the non-linear characteristic of the power amplifier is available, the bias voltage of variable gain amplifier 2 is fixed to keep the output thereof constant, and the bias voltages of linear amplifiers 3 and 4 and non-linear amplifier 17 in the latter stages are adjusted by the voltage connected through the control voltage terminal 9 to change the output thereof, thereby conducting a bias voltage control of power amplifier 1 as a whole.

By utilizing two amplification methods of the input signal level control and the bias voltage control as described above, the bias voltage of the power amplifier 1 can be set at the optimum bias point for both the linear characteristic and the non-linear characteristic and hence the characteristics of the power amplifier 1 can be improved in both efficiency and linearity for the required output.

Further, in the case of the linear amplification, since the power is amplified by controlling the gain of variable gain amplifier 2 and there is a limit to the gain control range of variable gain amplifier 2, variable gain amplifier 2 can not respond to a request to raise the gain larger than a limit.

A second preferred embodiment of the present invention will be described in detail with reference to the accompanying drawings.

Figure 4:
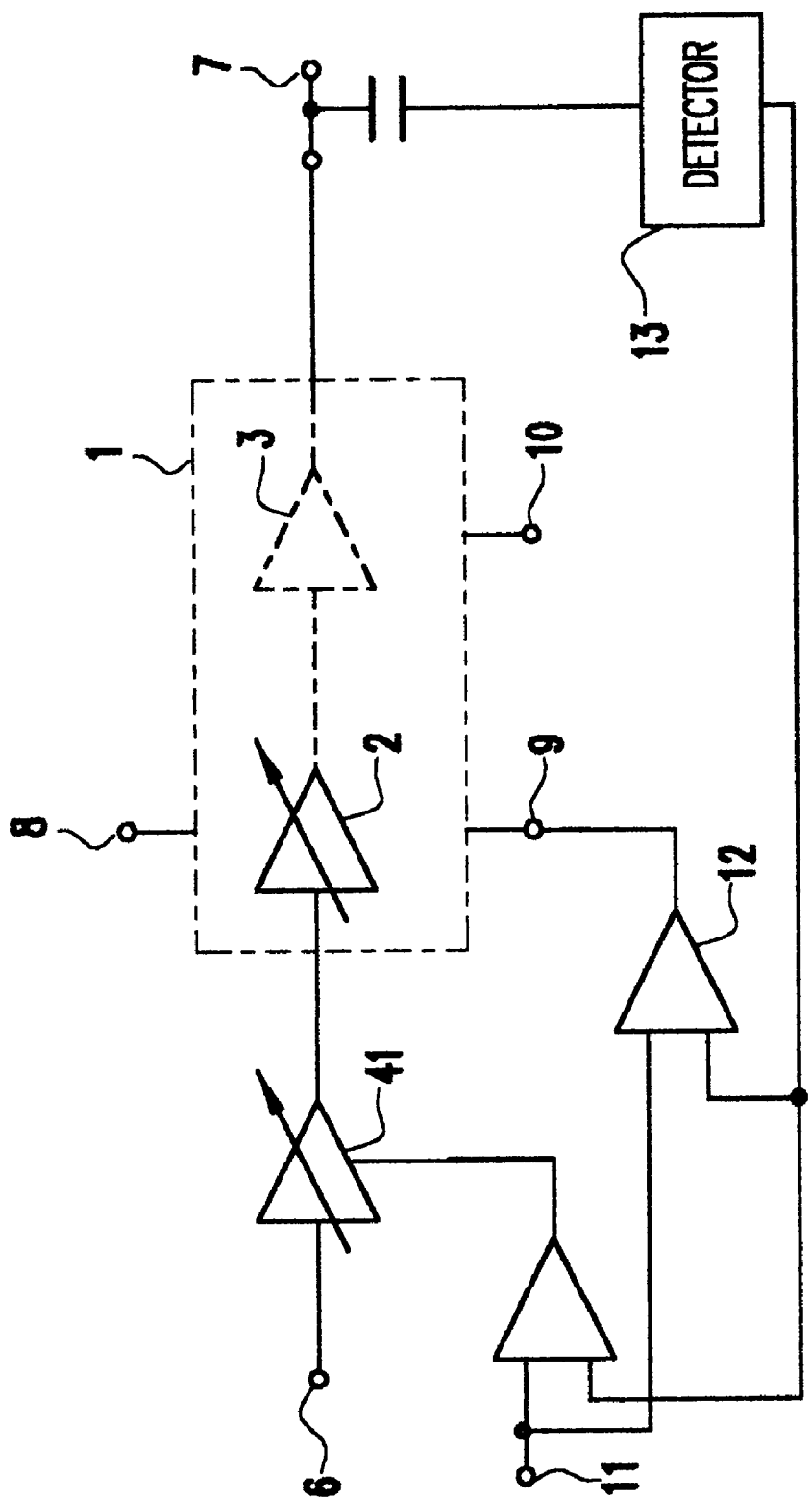
FIG. 4 is a circuit diagram of a second preferred embodiment of a power amplifier in accordance with the present invention, and shows a state in which a second variable gain amplifier is provided on the outside of the first variable gain amplifier.

Referring to FIG. 4, an exterior variable gain amplifier 41 is provided before the power amplifier 1 and the gain control range can be expanded by distributing the gain range for exterior variable gain amplifier 41 and variable gain amplifier 2 in the power amplifier 1.

This preferred embodiment has a new effect that the power can be amplified in the expanded gain control range by the addition of the exterior variable gain amplifier 41 to power amplifier 1.

Further, in the structure of a conventional dual mode transmitter receiver, it has been difficult to apply for both analog and digital modes to keep the power efficiency of the power amplifier and to reduce a noise in the receiving band which is generated at the transmitting side.

In the case of the analog mode, the noise in the receiving band generated by the power amplifier have an effect on a receiving sensitivity, hence need to reduce the noise in receiving band sufficiently at the transmitter side.

Therefore, it is necessary to operate power amplifier 1 in a saturated state where the gain raises dull by setting the level diagram of the transmitter of the power amplifier 1 and to make second variable gain amplifier 41 apply a sufficiently high input power level to power amplifier 1.

In the case of the digital mode, a linear amplification is necessary because the data comprises amplitude component and hence the power amplifier can not be used in the saturated state. Therefore, it is necessary to change the gain of the power amplifier by setting the bias voltage of the power amplifier 1 to a bias voltage value lower than in the case of the analog mode. However, it is not optimum in terms of the power efficiency of the power amplifier to change the gain of the power amplifier so as to reduce the noise in the receiving band.

Figure 5:
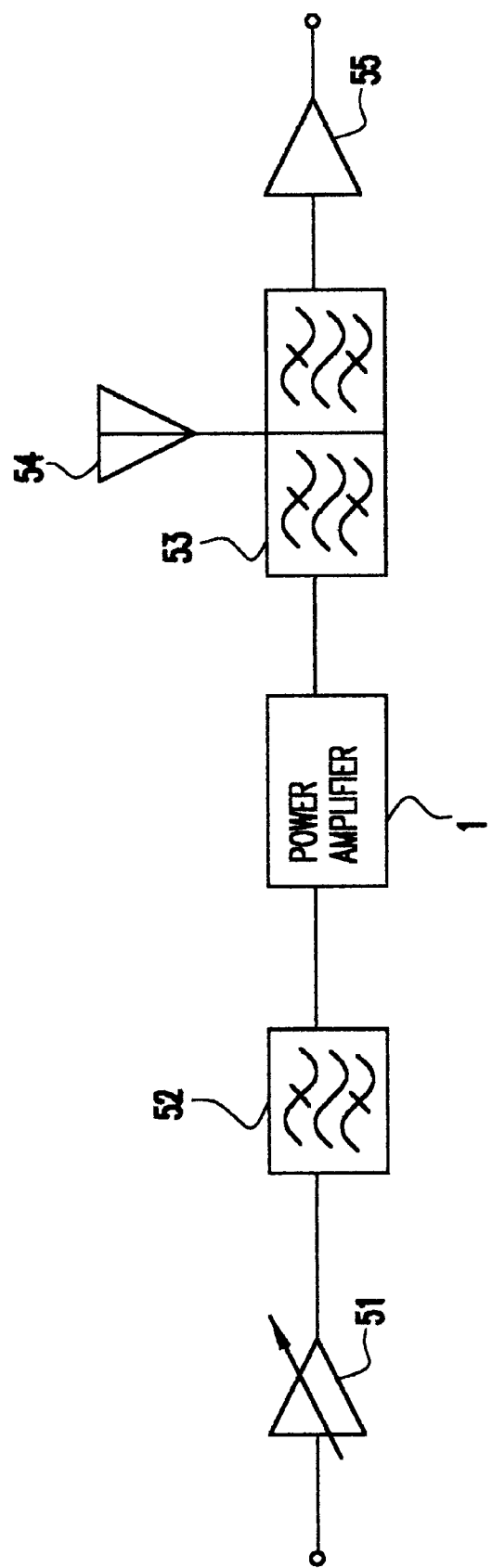
FIG. 5 is a block diagram of a third preferred embodiment of a power amplifier in accordance with the present invention, showing a connection in which an inter-stage filter is interposed between the first and second variable gain amplifiers of the power amplifier of the second preferred embodiment in accordance with the present invention.

Consequently, in the third preferred embodiment of the present invention, as shown in FIG. 5, the transmitter receiver is constituted by a variable gain amplifier 51, an inter-stage filter 52, a power amplifier 1, an antenna-shared unit 53, antenna 54, and a low-noise amplifier 55. In this preferred embodiment, the inter-stage filter 52 is disposed as a band pass filter before the power amplifier 1 to remove the noises in the receiving band.

As described above, in the analog mode, the modulated signal needs to be amplified in highest level and applied to the power amplifier 1 which is set to a saturated state with less gain, hence the bias voltage of the variable gain amplifier 51 is adjusted such that the variable gain amplifier 51 can amplify the signal to the highest level and applies to the power amplifier 1 and is adjusted so as to amplify the power with saturate state having less amplification factor to reduce the noises in the receiving band at the transmitting side. In the digital mode, the bias voltage of the variable gain amplifier 51 is adjusted to the level in normal gain and applied to the power amplifier 1 which amplifies the applied signal at the lower state from the saturated state.

As described above, the power amplifier in accordance with the present invention does not need a plurality of power amplifiers corresponding to a plurality of systems of analog and digital and made of modifications. This can reduce the number of parts of the power amplifier and reduces the size thereof.

This is because the power amplifier in accordance with the present invention has only one input port and one output port and can switch two amplification paths therein according to the request of the system of signal.

Further, since the power amplification system suitable for a plurality of modulation modes can be selected for a plurality of systems, one power amplifier can satisfy the request of the system by selecting the optimum amplification path of the power amplifier according to the modulation mode and by providing a peripheral control circuit.

This is because the power amplifier comprises a linear amplifier path and a non-linear amplifier path.

Further, in order to reduce the power consumption of the power amplifier by sharing the control circuits of the power amplifier, utilizing the power amplifier at the optimum state according to the system and providing with shared bias voltage control circuit.

What is claimed is:

1. A power amplifier comprising:
   a first amplification path including a first variable gain amplifier and at least one linear amplifier;
   a second amplification path having a non-linear amplifier;
   selecting means for selectively connecting a received signal to at least one of said first amplification path and said second amplification path;
   bias control means for controlling the bias voltage of said linear amplifier, wherein the bias control means comprises:
   a wave detector for detecting an output power level; and
   a comparator for outputting the difference between an inputted control voltage and the output of the wave detector.

2. A power amplifier comprising:
   means for power amplifying at least a signal modulated in one modulation mode at least one amplification path available for amplifying a signal in the corresponding modulation mode;
   selecting means for selectively connecting a received signal to the corresponding amplification path;
   bias controlling means for controlling the bias voltage of at least a component linear amplifier,
   wherein the amplification Rath comprises:
   a first amplification path including a first variable gain amplifier and at least one linear amplifier; and
   a second amplification path having a non-linear amplifier in addition to the first amplification path;
   wherein the bias controlling means comprises:
   a wave detector for detecting an output power level; and a comparator for outputting the difference between an inputted control voltage and the output of the wave detector, wherein, in the first amplification path, the output of the first variable gain amplifier which is controlled to have a required amplification factor by the output voltage of the bias control means is applied to the linear amplifier which is kept to a predetermined amplification factor, and in the second amplification path, the output of the first variable amplifier is kept to a constant amplification factor is applied to a group of amplifiers including the linear amplifier and the non-linear amplifier which amplify the inputted level to a required output level by controlling the bias voltage through the output of the bias control means.

3. A power amplifier as claimed in claim 2, further including a second variable gain amplifier added externally to which a bias voltage is applied in parallel to the first variable gain amplifier and which is connected to the input side of the first variable amplifier.

4. A power amplifier as claimed in claim 3, wherein, for an analog signal, an amplification path after the first variable gain amplifier is set to a saturated state and the second variable gain amplifier amplifies the inputted analog signal to a high power level by adjusting the bias voltage thereof and applies the output to the amplification path and the amplification path amplifies the analog signal at its saturated state thereby reducing noises in a receiving band generated in the power amplification, and for a digital signal, the amplification path after the first variable gain amplifier is set to a level below the saturated state by adjusting the bias voltage thereof and amplifies the output of the second variable gain amplifier.

5. A power amplifier as claimed in claim 4, further comprising an inter-stage band pass filter placed between the second variable gain amplifier and the first variable gain amplifier.

* * * * *